(12) United States Patent
Iwama et al.

(10) Patent No.: US 9,165,961 B2
(45) Date of Patent: Oct. 20, 2015

(54) SOLID-STATE IMAGING DEVICE

(71) Applicant: KABUSHIKI KAISHA TOSHIBA, Tokyo (JP)

(72) Inventors: Mitsuhiro Iwama, Kanagawa (JP); Yasuhiro Koshio, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 28 days.

(21) Appl. No.: 14/191,272

(22) Filed: Feb. 26, 2014

(65) Prior Publication Data
US 2015/0054112 A1 Feb. 26, 2015

(30) Foreign Application Priority Data

Aug. 1, 2013 (JP) ................................. 2013-160391

(51) Int. Cl.
*H01L 27/146* (2006.01)
(52) U.S. Cl.
CPC ................................ *H01L 27/14618* (2013.01)
(58) Field of Classification Search
USPC .......................... 257/443, 219, 225, 240, 246
See application file for complete search history.

(56) References Cited

U.S. PATENT DOCUMENTS

| 5,433,911 A * | 7/1995 | Ozimek et al. ................. 264/261 |
| 7,659,136 B2 | 2/2010 | Maeda et al. |
| 2005/0275746 A1 | 12/2005 | Nishida et al. |
| 2006/0180887 A1 | 8/2006 | Ono |
| 2012/0032284 A1 * | 2/2012 | Dejima et al. ................. 257/415 |

FOREIGN PATENT DOCUMENTS

JP 2013-004534 A 1/2013

* cited by examiner

*Primary Examiner* — Marc Armand
(74) *Attorney, Agent, or Firm* — Patterson & Sheridan, LLP

(57) ABSTRACT

A solid-state imaging device includes a dielectric substrate, a solid-state imaging element disposed on the dielectric substrate, and including a photosensitive unit at a portion of a front surface thereof, an adhesive between the dielectric substrate and the solid-state imaging element, connection conductors, a sealant, and an upper package part. The solid-state imaging element includes a photosensitive unit at a portion of a front surface thereof, and is bonded to the dielectric substrate by the adhesive such that the adhesive is in contact with a portion of a rear surface of the solid-state imaging element so as to permit air flow along other portions of the rear surface of the solid-state image element. The connection conductors electrically connect the solid-state imaging element and the dielectric substrate. The upper package part is provided on the front surface of the solid-state imaging element so as to hermetically seal the photosensitive unit.

20 Claims, 11 Drawing Sheets

SOLID-STATE IMAGING DEVICE

CROSS-REFERENCE TO RELATED APPLICATION

This application is based upon and claims the benefit of priority from Japanese Patent Application No. 2013-160391, filed Aug. 1, 2013, the entire contents of which are incorporated herein by reference.

FIELD

Embodiments described herein relate generally to a solid-state imaging device.

BACKGROUND

In general, a digital camera has a solid-state imaging device for receiving light, and transmitting a signal voltage according to the amount of light received. For example, in high-end digital cameras such as a digital single-lens reflex camera of a full size, an APS-C size, or the like. In particular, CMOS image sensor packages having large optical sizes have been used as solid-state imaging devices. Large CMOS image sensor packages generally have a solid-state imaging element and a package provided to cover the whole of the solid-state imaging element.

In these kinds of solid-state imaging devices, a small solid-state imaging device is configured by dividing a package into an upper part and a lower part, disposing a solid-state imaging element on a substrate which resides in the lower package part, and hermetically sealing only a photosensitive unit of the solid-state imaging element with the upper package part.

In such a solid-state imaging device according to the related art, the solid-state imaging element and the substrate which resides in the lower package part are electrically connected to each other by wires provided at the peripheral portion of the solid-state imaging element. With the configuration described above, the upper package part covers only the photosensitive unit of the solid-state imaging element. Therefore, the wires are provided on the outside of the upper package part. As a result, the wires need to be sealed with a resin or the like.

However, in the solid-state imaging device according to the related art, the resin for sealing the wires covers the entire periphery of the solid-state imaging element to facilitate manufacturing. Also, the upper side of the solid-state imaging element is hermetically sealed within the upper package part. Further, since the entire periphery of the solid-state imaging element is covered with the resin as described above, the solid-state imaging element is disposed on the surface of the substrate which resides in the lower package part, and is fixed thereto by an adhesive applied on the entire rear surface of the element.

In the solid-state imaging device according to the related art described above, all of the front surface, rear surface, and side surface of the solid-state imaging element are covered by the package, creating a problem of poor heat dissipation. Further, since the adhesive is applied onto the entire rear surface of the solid-state imaging element, stress on the solid-state imaging element increases due to a difference in thermal expansion coefficient between the solid-state imaging element and the adhesive, and thus deformation such as warpage of the solid-state imaging element occurs.

DETAILED DESCRIPTION

An object of an embodiment is to provide a solid-state imaging device having better heat dissipation and reduced deformation of a solid-state imaging element residing therein.

In general, according to one embodiment, a solid-state imaging device includes a dielectric substrate, a solid-state imaging element, an adhesive, connection conductors, a sealant, a frame-shaped spacer, and an optical lid. The solid-state imaging element includes a photosensitive unit at a portion of a front surface thereof. The adhesive is between the dielectric substrate and the solid-state imaging element and is in contact with a portion of the rear surface of the solid-state imaging element so as to permit air flow along other portions of the rear surface of the solid-state image element. The connection conductors electrically connect the solid-state imaging element and the dielectric substrate. The spacer is provided on the front surface of the solid-state imaging element to surround the photosensitive unit. The optical lid is provided on the spacer.

Figure 1:
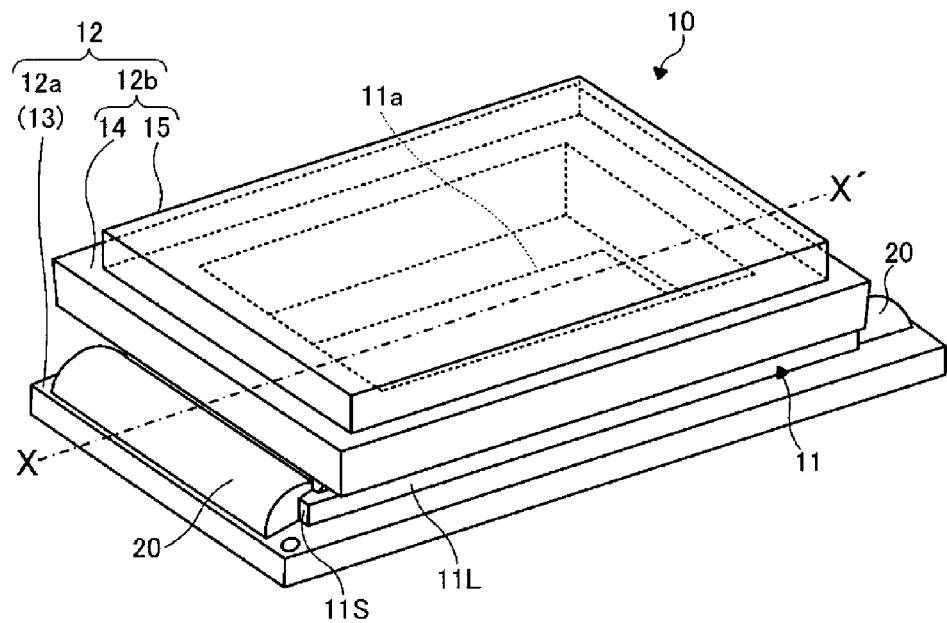
FIG. 1 is a perspective view illustrating a solid-state imaging device according to an embodiment.

Hereinafter, a solid-state imaging device according to an embodiment will be described. FIG. 1 is a perspective view illustrating the solid-state imaging device according to the present embodiment. In the solid-state imaging device 10 according to the embodiment and shown in FIG. 1, a partial area including a photosensitive unit 11a of a solid-state imaging element 11 which is, for example, a CMOS image sensor is hermetically sealed with a package 12.

The package 12 is divided into a lower package part 12a and an upper package part 12b. The lower package part 12a includes a dielectric substrate 13 having a rectangular plate shape. As the dielectric substrate 13, for example, a ceramic substrate, which has a superior heat dissipation property, is used.

The upper package part 12b includes a spacer 14 and an optical lid 15. The spacer 14 is made of a resin in a frame shape having an opening at the substantially central portion. The opening of the spacer 14 needs to be formed to be larger than at least the photosensitive unit 11a of the solid-state imaging element 11.

The optical lid 15 includes a transparent substrate, which has a rectangular plate shape and is made of glass or the like, capable of transmitting light received. This optical lid 15 is disposed on the upper surface of the spacer 14.

The solid-state imaging device 10 with this package 12 is a small device in which the solid-state imaging element 11 is disposed between the lower package part 12a and the upper package part 12b.

Figure 2:
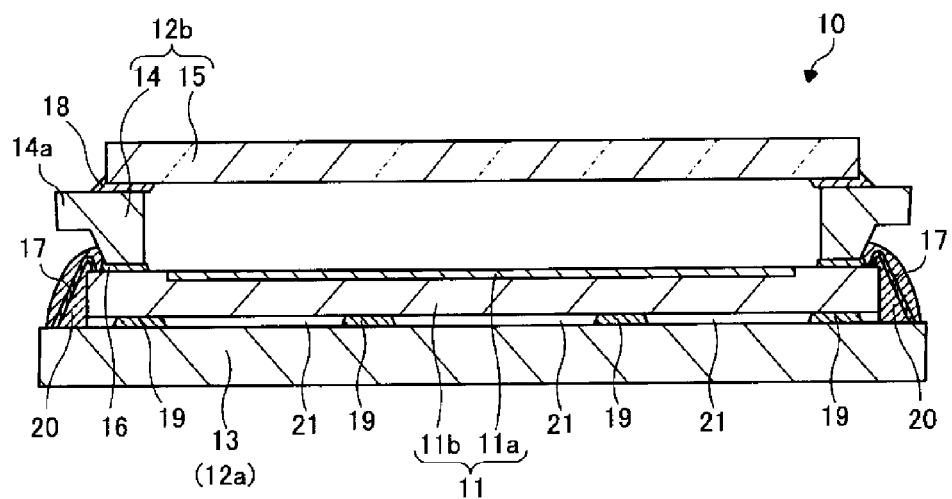
FIG. 2 is a cross-sectional view of the solid-state imaging device taken along an alternate long and short dash line X-X' of FIG. 1.

FIG. 2 is a cross-sectional view of the solid-state imaging device 10 taken along an alternate long and short dash line X-X' of FIG. 1. As depicted in FIG. 2, the solid-state imaging element 11 includes the photosensitive unit 11a on the front surface of a semiconductor substrate 11b made of, for example, silicon. Although not shown, the photosensitive unit 11a is an area where a plurality of pixels each including a photodiode for receiving light is arranged, for example, in a lattice pattern.

On the front surface of this solid-state imaging element 11, the spacer 14 is disposed to surround a partial area including the photosensitive unit 11a. Between the front surface of the solid-state imaging element 11 and the lower surface of the spacer 14, a spacer adhesive 16 composed of, for example, a thermosetting adhesive is provided, such that the spacer 14 is fixed on the front surface of the solid-state imaging element 11 by the adhesive 16.

As is described below, the peripheral portion of the front surface of the solid-state imaging element 11 and the dielectric substrate 13 are electrically connected to each other by connection conductors 17 such as wires, and the spacer 14 is fixed between the photosensitive unit 11a and the peripheral portion (the connection area of the connection conductors 17) on the front surface of the solid-state imaging element 11.

Also, in the present embodiment, at a portion of the upper side of the spacer 14, a protruding portion 14a is provided to protrude toward the outside. In this spacer 14, the upper surface has an area wider than the lower surface. Therefore, it is possible to reduce the displacement accuracy of the optical lid 15 which is disposed on the spacer 14. When the displacement accuracy of the optical lid 15 is sufficiently high, it is unnecessary to form the protruding portion 14a at the spacer 14.

On the upper surface of this spacer 14, the optical lid 15 is disposed. Between the upper surface of the spacer 14 and the optical lid 15, a lid seal agent 18 composed of, for example, an ultraviolet curable adhesive is provided, and the optical lid 15 is fixed on the upper surface of the spacer 14 by the lid seal agent 18.

That is, the upper package part 12b including the spacer 14 and the optical lid 15 having been described above forms a hollow portion on the partial area, including the photosensitive unit 11a, of the front surface of the solid-state imaging element 11, and is disposed and fixed to hermetically seal the upper side of the partial area of the front surface of the solid-state imaging element 11. Therefore, materials such as dust, which reduces image quality, are suppressed from coming onto the front surface of the photosensitive unit 11a.

Meanwhile, the above described solid-state imaging element 11 is disposed on the dielectric substrate 13 which is the lower package part 12a. Between the front surface of the dielectric substrate 13 and the rear surface of the solid-state imaging element 11, a die bond agent 19 is locally provided, and the solid-state imaging element 11 is fixed on the front surface of the dielectric substrate 13 by the die bond agent 19.

Also, the die bond agent 19 conducts heat generated in the solid-state imaging element 11 to the dielectric substrate 13. Therefore, in order to improve the efficiency of the heat conduction, it is preferable to provide a few portions of the die bond agent 19 directly below the photosensitive unit 11a, which is a heat source of the solid-state imaging element 11.

Also, the die bond agent 19 includes, for example, a thermosetting adhesive; however, it is possible to use any material as long as when the corresponding material is cured, the rear surface of the solid-state imaging element 11 is separated from the front surface of the dielectric substrate 13 by a predetermined distance.

Also, the solid-state imaging element 11 and the dielectric substrate 13 are electrically interconnected by a plurality of connection conductors 17 such as wires. One end of each of the plurality of connection conductors 17 is connected to the peripheral portion of the solid-state imaging element 11 which is on the outside of the upper package part 12b.

In this arrangement, the above described connection conductors 17 are exposed to the outside of the package 12. Therefore, in order to protect the connection conductors 17, the connection conductors 17 are sealed with a sealant 20.

Figure 3:
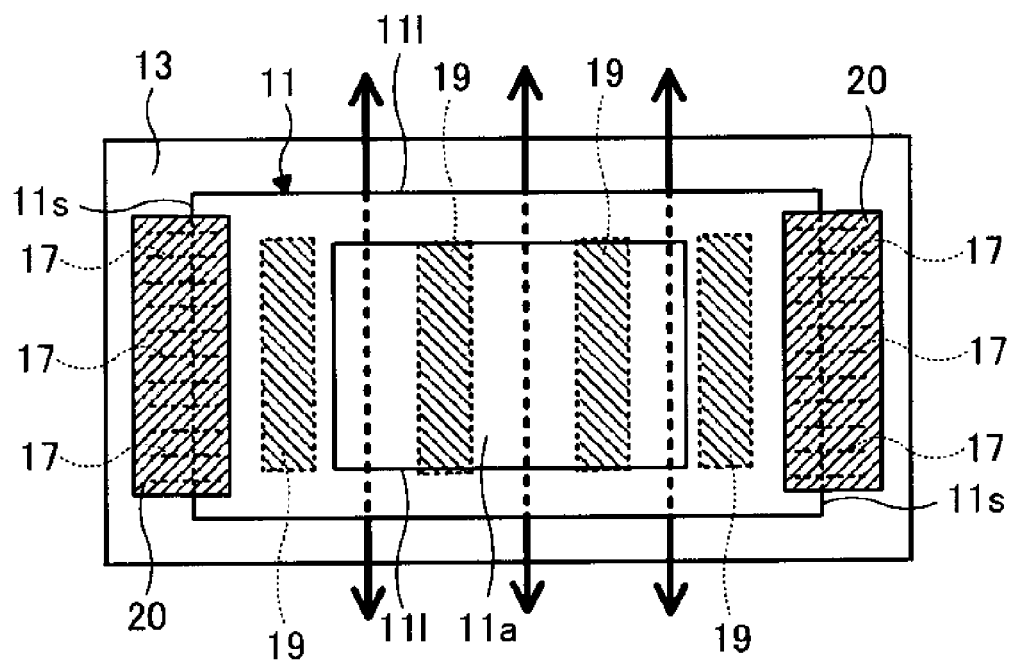
FIG. 3 is a top view schematically illustrating the solid-state imaging device without an upper package part.

Here, positions where the die bond agent 19, the connection conductors 17, and the sealant 20 are provided are described in more detail with reference to FIG. 3. FIG. 3 is a top view schematically illustrating the solid-state imaging device 10 without the upper package part 12b. In FIG. 3, arrows represent air movement paths.

As depicted in FIG. 3, the plurality of connection conductors 17 for connecting the solid-state imaging element 11 and the dielectric substrate 13 is provided along short sides 11s of the solid-state imaging element 11 facing each other. Therefore, along the short sides 11s of the solid-state imaging element 11, the sealant 20 is provided to seal all of the connection conductors 17.

Also, the sealant 20 needs only to be capable of sealing the connection conductors 17. Therefore, as depicted in FIG. 1, the sealant 20 does not necessarily need to cover all of side surfaces 11S along the short sides 11s of the solid-state imaging element 11, and it is preferable to provide the sealant 20 such that some portions of the side surfaces 11S are exposed.

The sealant 20 is provided as described above, whereby at least two side surfaces 11L (FIG. 1), being in contact with long sides 111 of the solid-state imaging element 11, are exposed without being covered with the sealant 20. In the present embodiment, the whole surfaces of the two side surfaces 11L along the long sides 111 of the solid-state imaging element 11 are exposed, and some portions of the two side surfaces 11S along the short sides 11s of the solid-state imaging element 11 are exposed.

With respect to the sealant 20 provided as described above, as depicted in FIG. 3, the die bond agent 19 is provided in a multi-strip shape in which a plurality of (for example, four) strips is parallel to the short sides 11s of the solid-state imaging element 11. Each strip of the plurality of die bond agent 19 is separated from each other at predetermined intervals and arranged to not be in contact with the short sides 11s and long sides 111 of the solid-state imaging element 11.

The sealant 20 and the die bond agent 19 are provided as described above, whereby air vents 21 (FIG. 2), which are spaces for air movement, are formed between the front surface of the dielectric substrate 13 and the rear surface of the solid-state imaging element 11.

According to this structure, in the solid-state imaging element 11, at least some portions of the side surfaces 11L and 11S and the rear surface are exposed to air.

Also, the air vents 21 do not necessarily need to let air therethrough, and may let a coolant for holding the solid-state imaging element 11 at a predetermined temperature therethrough.

A method of manufacturing the above described solid-state imaging device 10 is now described with reference to FIGS. 4 to 12. Each of the FIGS. 4 to 12 is a perspective view that corresponds to FIG. 1 and illustrates a step in the method of manufacturing the solid-state imaging device 10 according to the embodiment.

Figure 4:
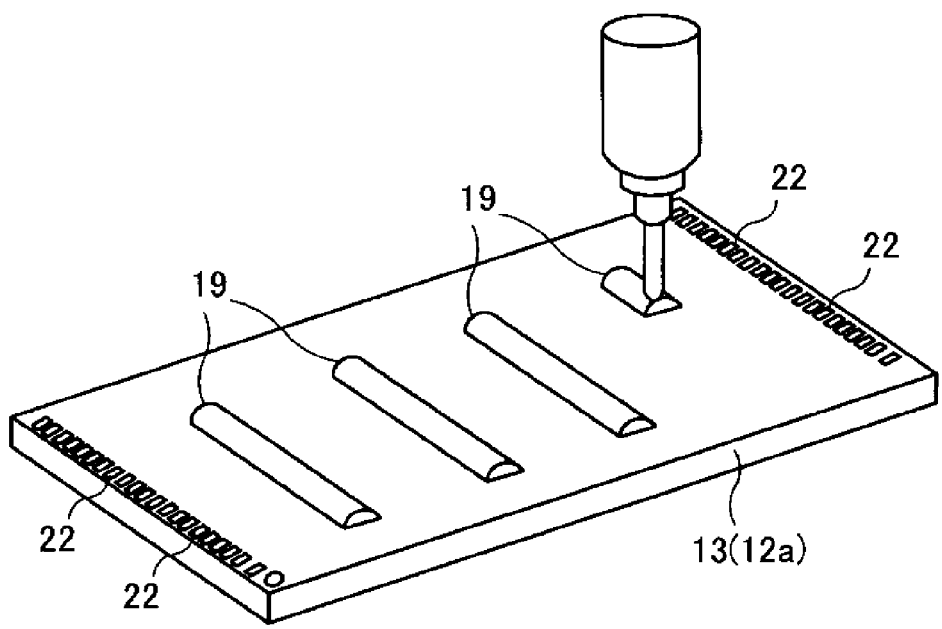
FIG. 4 is a perspective view, which corresponds to FIG. 1, illustrates a step in a method of manufacturing the solid-state imaging device according to the embodiment.

First, as depicted in FIG. 4, on the front surface of the dielectric substrate 13 in the lower package part 12a, a plurality of die bond agent strips 19 composed of, for example, a thermosetting adhesive is formed in parallel to each other. These die bond agent strips 19 are formed to be separated from each other at predetermined intervals. Also, on the front surface of the peripheral portion of the dielectric substrate 13, at short side areas, a plurality of electrode pads 22 is provided along the short sides of the substrate 13. Each of the die bond agent strips 19 is provided, for example, in parallel to the lines of the electrode pads 22.

Figure 5:
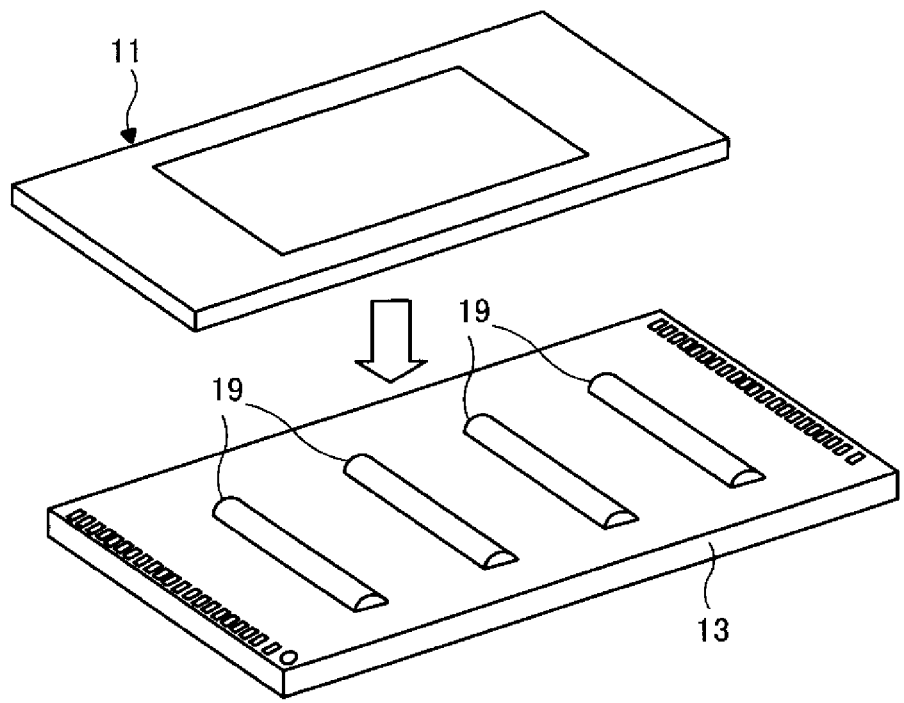
FIG. 5 is a perspective view, which corresponds to FIG. 1, illustrates a step in the method of manufacturing the solid-state imaging device according to the embodiment.

Next, as depicted in FIG. 5, on dielectric substrate 13, the solid-state imaging element 11 is disposed such that the rear surface of the solid-state imaging element 11 is in contact with the plurality of die bond agent strips 19, and is separated from the front surface of the dielectric substrate 13. Thereafter, while this state is maintained, the plurality of die bond agent strips 19 is cured, for example, by heat. As a result, the solid-state imaging element 11 is fixed on the dielectric substrate 13 by the plurality of die bond agent strips 19 such that the rear surface of the solid-state imaging element 11 is separated from the front surface of the dielectric substrate 13 by a predetermined distance.

Figure 6:
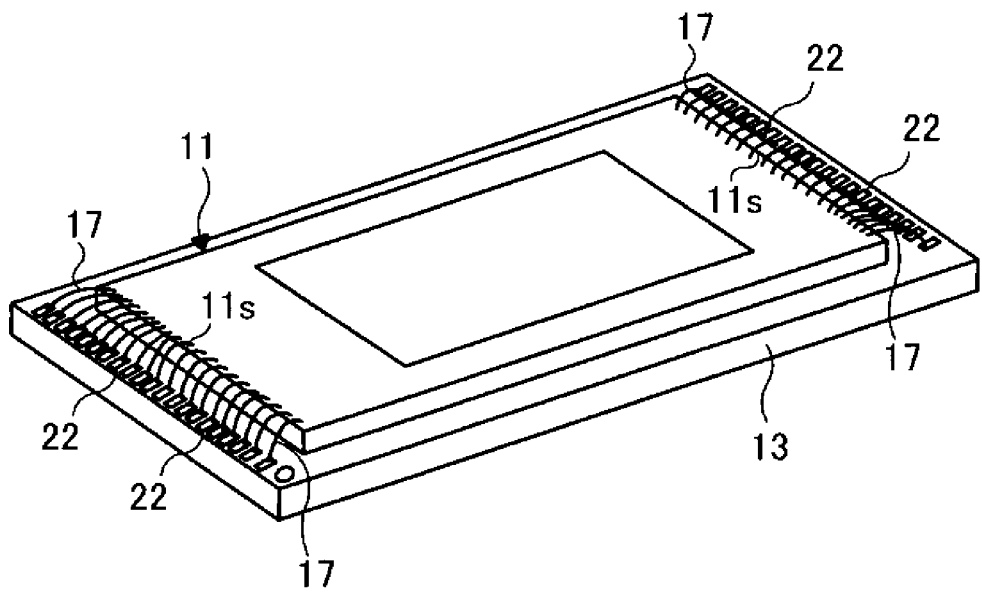
FIG. 6 is a perspective view, which corresponds to FIG. 1, illustrates a step in the method of manufacturing the solid-state imaging device according to the embodiment.

Next, as depicted in FIG. 6, in order to electrically connect the solid-state imaging element 11 and the dielectric substrate 13, pads on the peripheral portion of the solid-state imaging element 11, and the plurality of electrode pads 22 provided on the dielectric substrate 13 are connected by the connection conductors 17 such as wires. As a result, the plurality of connection conductors 17 is provided along the two short sides 11s of the solid-state imaging element 11.

Figure 7:
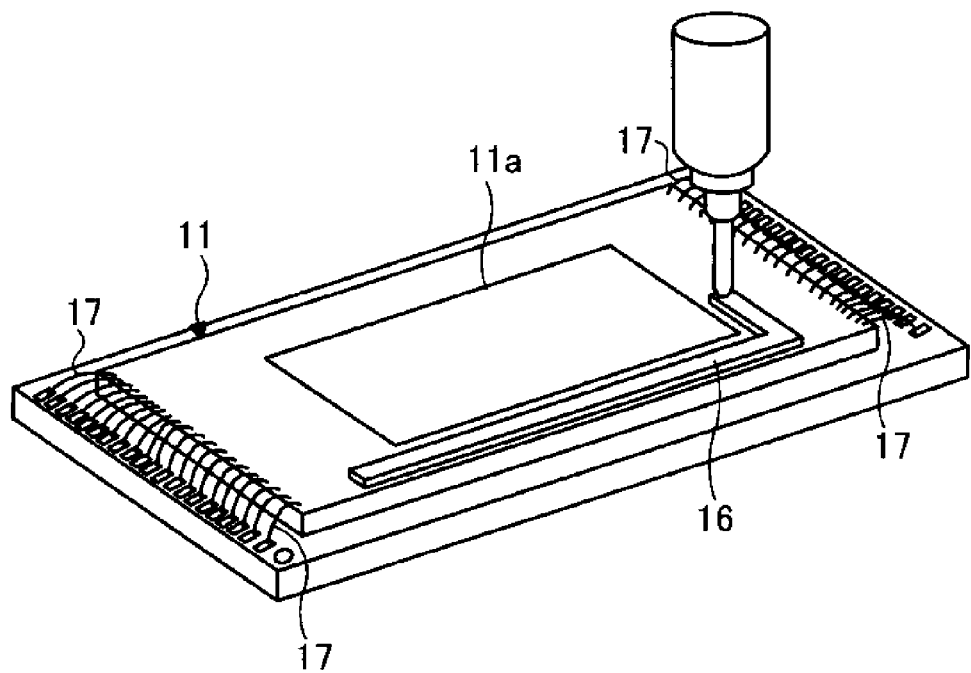
FIG. 7 is a perspective view, which corresponds to FIG. 1, illustrates a step in the method of manufacturing the solid-state imaging device according to the embodiment.

Next, as depicted in FIG. 7, on the front surface of the solid-state imaging element 11, on the outside of the photosensitive unit 11a and on the inner side from the areas where the connection conductors 17 have been formed, the spacer adhesive 16 is applied in a ring shape to surround the photosensitive unit 11a.

Figure 8:
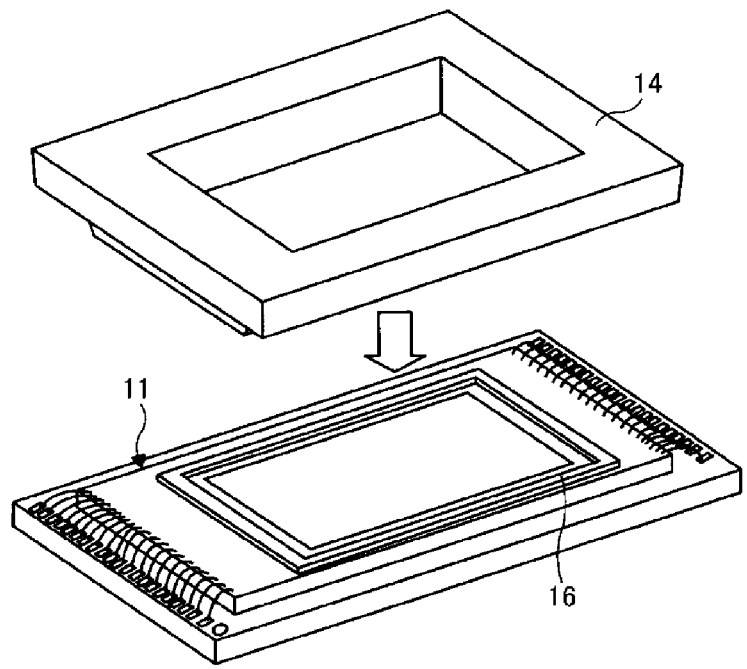
FIG. 8 is a perspective view, which corresponds to FIG. 1, illustrates a step in the method of manufacturing the solid-state imaging device according to the embodiment.

Next, as depicted in FIG. 8, the spacer 14 is disposed on the solid-state imaging element 11. The spacer 14 is fixed on the front surface of the solid-state imaging element 11 by the spacer adhesive 16.

Figure 9:
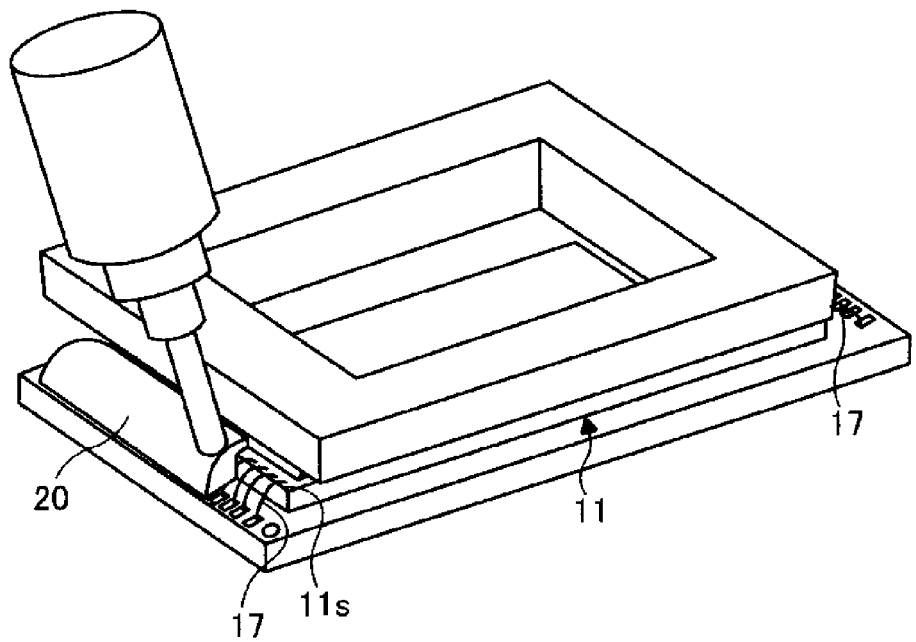
FIG. 9 is a perspective view, which corresponds to FIG. 1, illustrates a step in the method of manufacturing the solid-state imaging device according to the embodiment.
Figure 10:
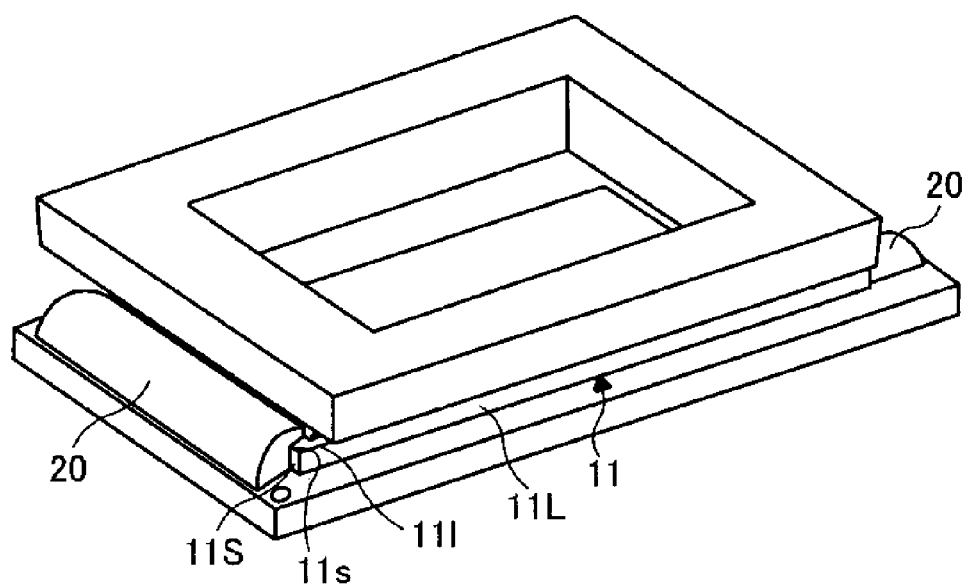
FIG. 10 is a perspective view, which corresponds to FIG. 1, illustrates a step in the method of manufacturing the solid-state imaging device according to the embodiment.

Next, as depicted in FIG. 9, along the short sides 11s of the solid-state imaging device 11, the sealant 20 is applied to cover all of the connection conductors 17. As depicted in FIG. 10, the sealant 20 is applied to cover only the connection conductors 17, allowing some portions of the two side surfaces 11S along the short sides 11s of the solid-state imaging element 11 to be exposed, and all of the two side surfaces 11L along the long sides 111 of the solid-state imaging element 11 to be exposed.

Figure 11:
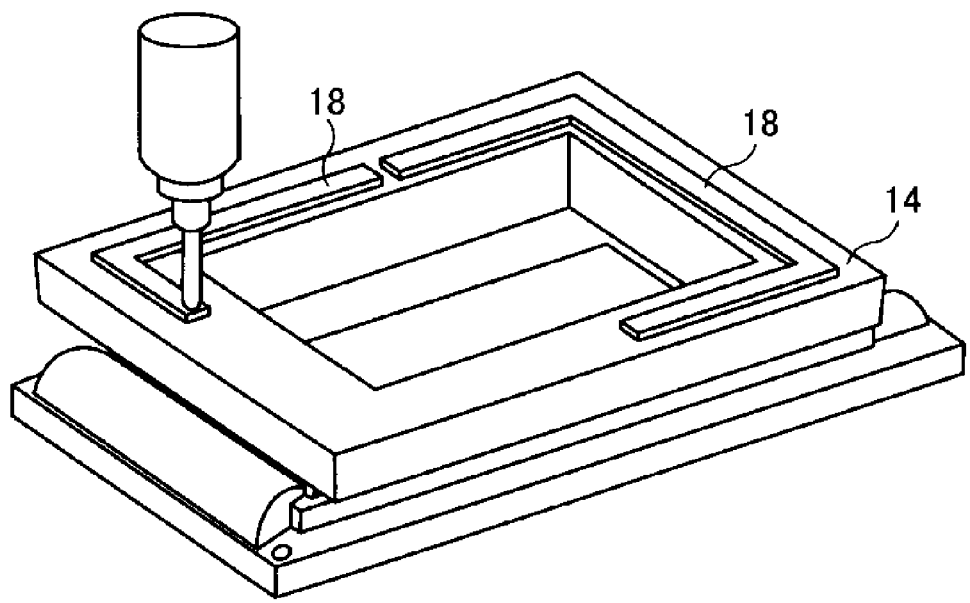
FIG. 11 is a perspective view, which corresponds to FIG. 1, illustrates a step in the method of manufacturing the solid-state imaging device according to the embodiment.
Figure 12:
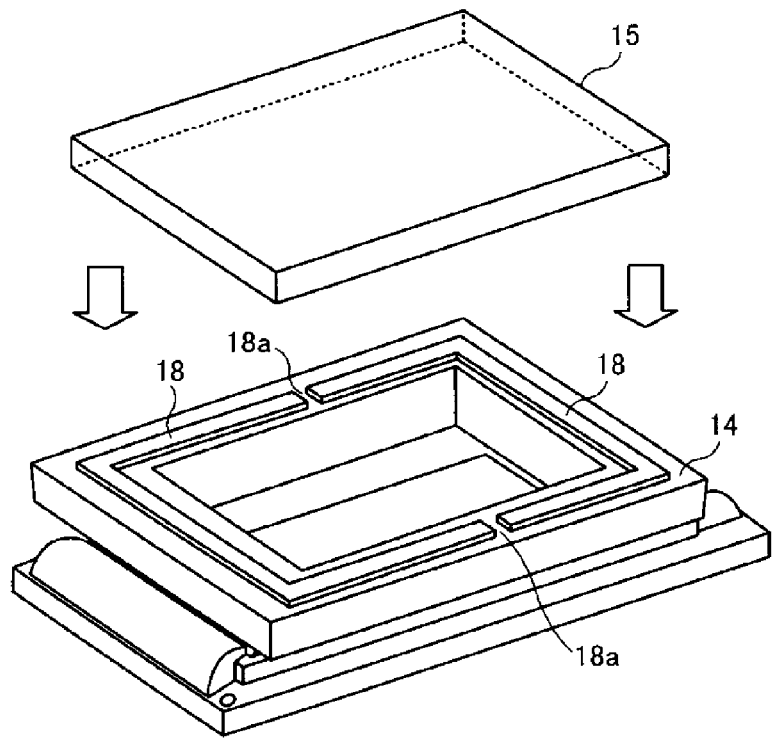
FIG. 12 is a perspective view, which corresponds to FIG. 1, illustrates a step in the method of manufacturing the solid-state imaging device according to the embodiment.

Next, as depicted in FIG. 11, on the upper surface of the spacer 14, the lid seal agent 18 is applied. The lid seal agent 18 is applied, for example, in two separate U-shaped portions on the upper surface of the spacer 14. Thereafter, as shown in FIG. 12, on the upper surface of the spacer 14 having the lid seal agent 18 applied thereon, the optical lid 15 is disposed such that the opening of the spacer 14 is closed. The optical lid 15 is fixed on the upper surface of the spacer 14 by the lid seal agent 18.

Also, when the optical lid 15 is disposed and fixed as shown in FIG. 12, a portion of air in the spacer 14 is discharged from gaps 18a of the lid seal agent 18 to the outside of the spacer 14.

Through the individual processes having been described above, the solid-state imaging device 10 according to the present embodiment is manufactured. Also, the dielectric substrate 13, which is used in the solid-state imaging device 10 according to the present embodiment, is obtained by separating a plurality of dielectric substrates formed on one wafer. Similarly, the solid-state imaging element 11 is also obtained by separating a plurality of solid-state imaging elements formed on one wafer. That is, the solid-state imaging device 10 according to the present embodiment is not manufactured by collectively forming a plurality of solid-state imaging devices in a wafer state and performing dicing, but is individually manufactured by assembling a separate dielectric substrate 13 and a separate solid-state imaging element 11 as shown in FIGS. 4 to 12.

In contrast to this, the solid-state imaging device according to the related art is manufactured by collectively forming a plurality of solid-state imaging devices and separating the solid-state imaging devices by dicing. Therefore, in a process of sealing the connection conductors connecting the solid-state imaging elements and the dielectric substrate, in order to facilitate manufacturing, a sealant is provided to fill in all of the gaps between the solid-state imaging devices. As a result, in the manufactured solid-state imaging device, all of the side surfaces of the solid-state imaging element are covered with the sealant. Therefore, the heat dissipation property of the solid-state imaging device according to the related art is poor.

Also, in a state where all of the side surfaces of the solid-state imaging element have been covered with the sealant as described above, in a case there is a space such as a void between the dielectric substrate and the solid-state imaging element, it is not possible to discharge air in the space to the outside of the device. Therefore, due to thermal expansion of the air in the space, the solid-state imaging element may be destroyed. For this reason, in the solid-state imaging device according to the related art, in order to prevent a space such as a void between the dielectric substrate and the solid-state imaging element from being formed, it is necessary to provide a die bond agent for fixing the solid-state imaging element on the dielectric substrate so as to cover the entire rear surface of the solid-state imaging element.

In the case where the die bond agent is provided to cover the entire rear surface of the solid-state imaging element, due to a difference in thermal expansion coefficient between the solid-state imaging element and the die bond agent, stress on the solid-state imaging element increases, and thus deformation such as warpage of the solid-state imaging element occurs.

As described above, in the solid-state imaging device 10 according to the present embodiment, the die bond agent 19 for fixing the solid-state imaging element 11 with respect to the dielectric substrate 13 is locally provided to be in contact with some portions of the rear surface of the solid-state imaging element 11. Further, the sealant 20 for sealing the connection conductors 17 electrically connecting the solid-state imaging element 11 and the dielectric substrate 13 is locally provided to expose some portions of the side surfaces 11S and the side surfaces 11L of the solid-state imaging element 11. As a result, some portions of the side surfaces 11S and the side surfaces 11L of the solid-state imaging element 11 are exposed, and air vents 21 are formed between the dielectric substrate 13 and the solid-state imaging element 11. Therefore, it is possible to improve the heat dissipation property, as compared to the solid-state imaging device according to the related art. As a result, it becomes easy to hold the temperature of the solid-state imaging device 10 at a predetermined temperature, and deterioration of the electrical properties of the device 10 due to an increase in the temperature of the solid-state imaging device 10 is reduced.

Further, since the die bond agent 19 is locally provided to be in contact with some portions of the rear surface of the solid-state imaging element 11, due to a difference in thermal expansion coefficient between the die bond agent 19 and the solid-state imaging element 11, it is possible to reduce stress on the solid-state imaging element 11, and it is possible to suppress deformation of the solid-state imaging element 11. As a result, it is possible to reduce deterioration of the imaging property due to disarrangement between the positions of the individual pixels of the photosensitive unit 11a and the focal positions of beams entering the individual pixels.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Figure 13:
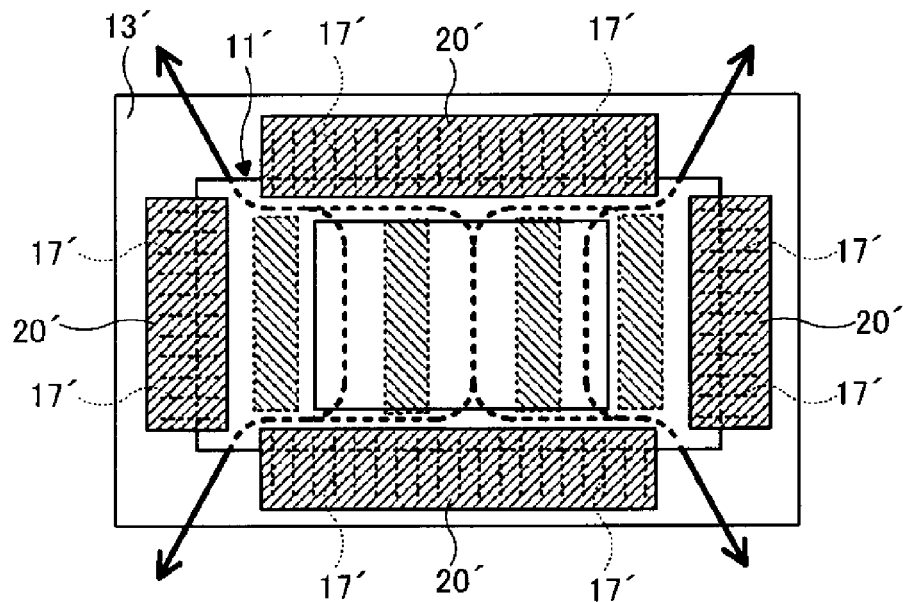
FIG. 13 is a top view, which corresponds to FIG. 3 and illustrates examples of positions where connection conductors are provided.
Figure 14:
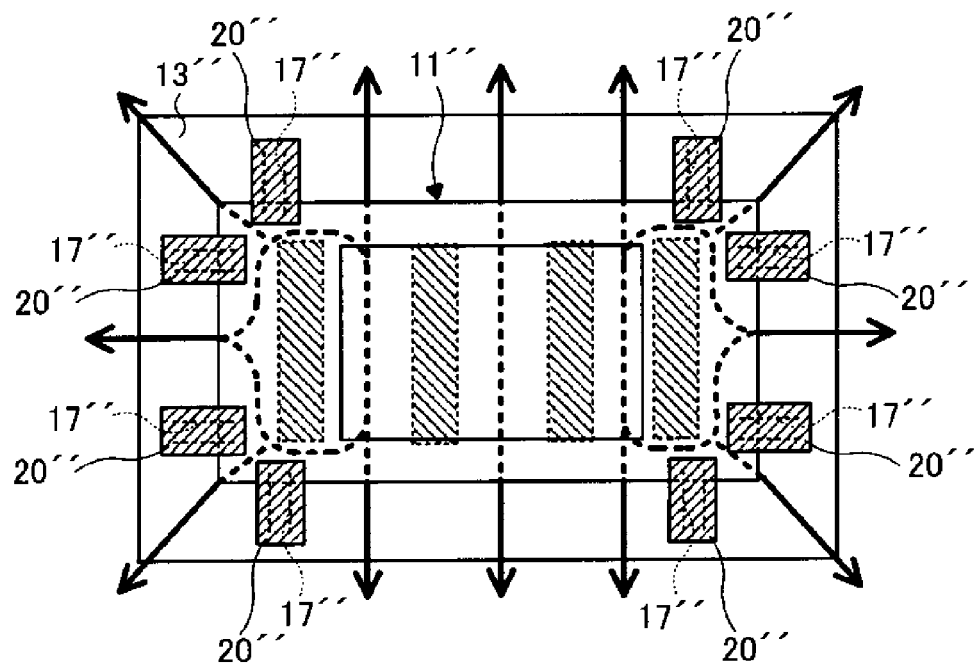
FIG. 14 is a top view, which corresponds to FIG. 3 and illustrates examples of positions where connection conductors are provided.

For example, in the solid-state imaging device 10 according to the above described embodiment, the connection conductors 17 for electrically connecting the solid-state imaging element 11 and the dielectric substrate 13 are provided along the short sides 11s of the solid-state imaging element 11. However, the positions where the connection conductors are provided are not limited to the above described embodiment. Hereinafter, some of examples of the positions where the connection conductors are provided are described with reference to FIGS. 13 and 14. FIGS. 13 and 14 are top views, which correspond to FIG. 3 and illustrate examples of the positions where the connection conductors, are provided. In FIGS. 13 and 14, arrows represent air movement paths.

As shown in FIG. 13, connection conductors 17' may be provided along all sides of a solid-state imaging element 11'. In this case, in order to seal all of the connection conductors 17', a sealant 20' for sealing the connection conductors 17' is provided along each side of the solid-state imaging element 11'. Here, when the sealant 20' is provided to expose some portions of the side surface of the solid-state imaging element 11', it is still possible to form air vents, which are spaces to be air movement paths, between the solid-state imaging element 11' and the dielectric substrate 13', and it is possible to improve the heat dissipation property.

Also, as shown in FIG. 14, connection conductors 17" may be provided at four corners of a solid-state imaging element 11". In this case, in order to seal all of the connection conductors 17", a sealant 20" for sealing the connection conductors 17" is provided along portions of both ends of each side of the solid-state imaging element 11". Here, when the sealant 20" is provided to expose some portions of the side surface of the solid-state imaging element 11", it is still possible to form air vents, which are spaces to be air movement paths, between the solid-state imaging element 11" and a dielectric substrate 13", and it is possible to improve the heat dissipation property.

Also, when the sealant 20, 20', or 20" is provided to expose some portions of the side surface of the solid-state imaging element 11, 11', or 11" as described above, it is possible to provide the die bond agent for boding and fixing the solid-state imaging element 11, 11', or 11" with respect to the dielectric substrate 13, 13', or 13", to be in contact only with some portions of the rear surface of the solid-state imaging element 11, 11', or 11". In the solid-state imaging device 10 according to the above described embodiment, the die bond agent 19 for bonding and fixing the solid-state imaging element 11 with respect to the dielectric substrate 13 is applied in the multi-strip shape in which the plurality of strips are parallel to the short sides 11s of the solid-state imaging element 11. However, the shape and application position of the die bond agent are not limited to the above described embodiment. Hereinafter, some of examples of the shape and application position of the die bond agent are described with reference to FIGS. 15A, 15B, 16, and 17A to 17C. FIGS. 15A, 15B, 16, and 17A to 17C are top views, which correspond to FIG. 3 and illustrate examples of the shape and application position of the die bond agent. In FIGS. 15A, 15B, 16, and 17A to 17C, arrows represent air movement paths.

Figure 15A:
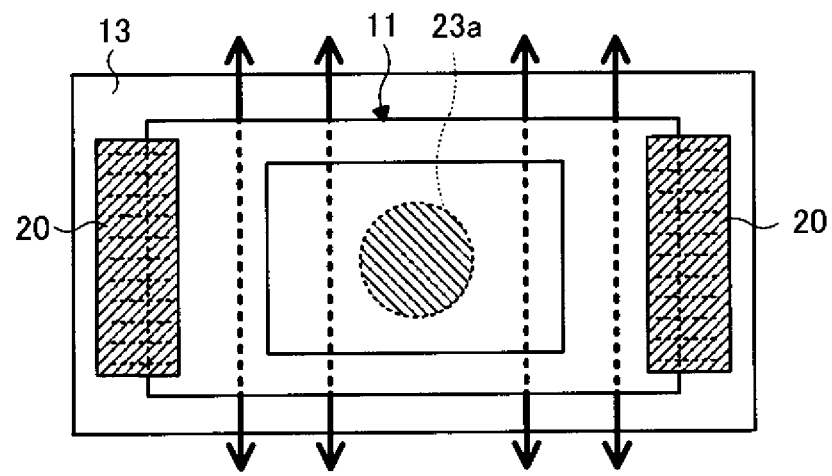
FIGS. 15A and 15B are top views, which correspond to FIG. 3 and illustrate examples of the shape and application position of a die bond agent.
Figure 15B:
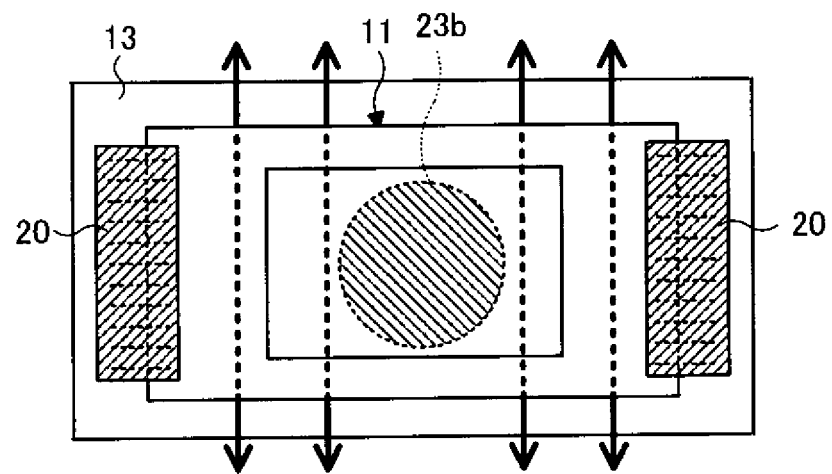
Figure 16:
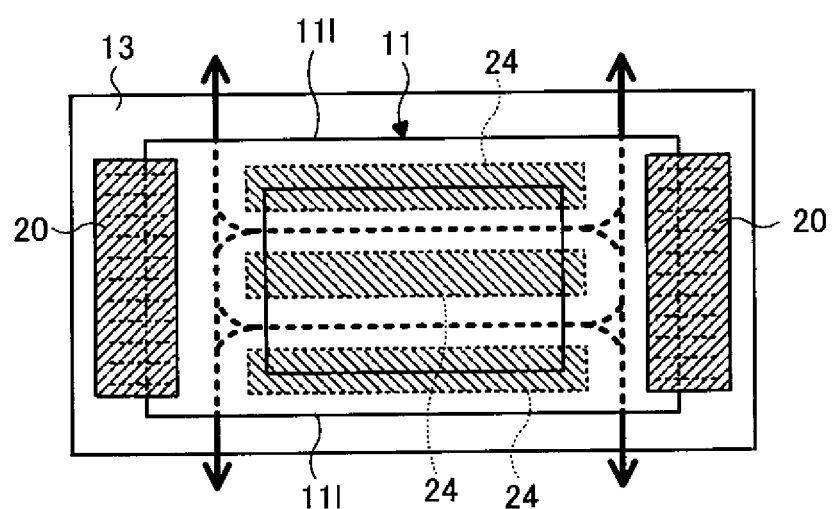
FIG. 16 is a top view, which corresponds to FIG. 3 and illustrates examples of the shape and application position of the die bond agent.

As shown in FIGS. 15A and 15B, die bond agents 23a and 23b may be provided in a circular shape. Also, as shown in FIG. 16, a die bond agent 24 may be provided in a multi-strip shape in which a plurality of strips are parallel to the long sides 11l of the solid-state imaging element 11. Further, as shown in FIGS. 17A and 17B, die bond agents 25a and 25b may be provided in a shape in which a plurality of circular shapes is separated from each other, and as shown in FIG. 17C, a die bond agent 26 may be provided in a multi-strip shape in which a plurality of strip shapes are at a plurality of positions separated from each other.

As described above, when the die bond agent 19, 23a, 23b, 24, 25a, 25b, or 26 is provided such that the die bond agent is in contact with some portions of the rear surface of the solid-state imaging element 11 and it is possible to dispose the solid-state imaging element 11 such that the rear surface of the solid-state imaging element 11 is separated from the front surface of the dielectric substrate 13, it is possible to form air vents, which are spaces to be air movement paths, between the solid-state imaging element 11 and the dielectric substrate 13, and it is possible to improve the heat dissipation property.

Figure 18:
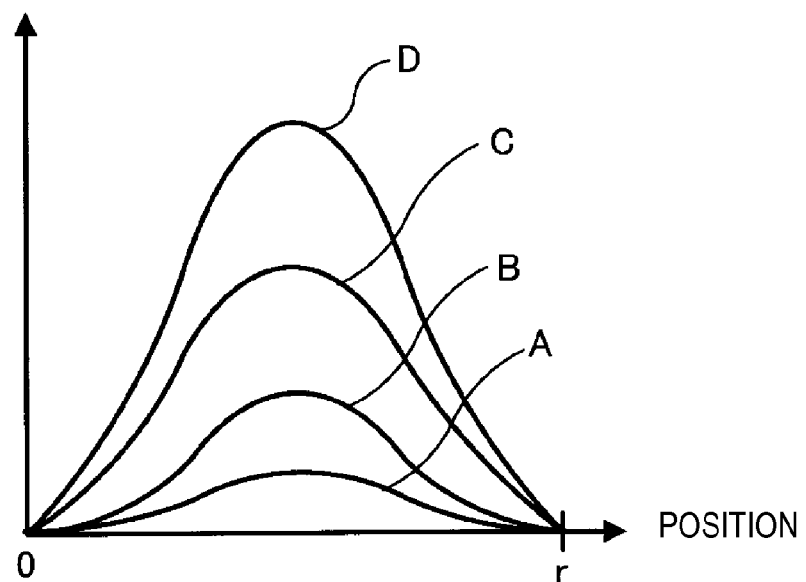
FIG. 18 is a view illustrating the shape and application position of the die bond agent and the amount of deformation of the solid-state imaging element.
Figure 19:
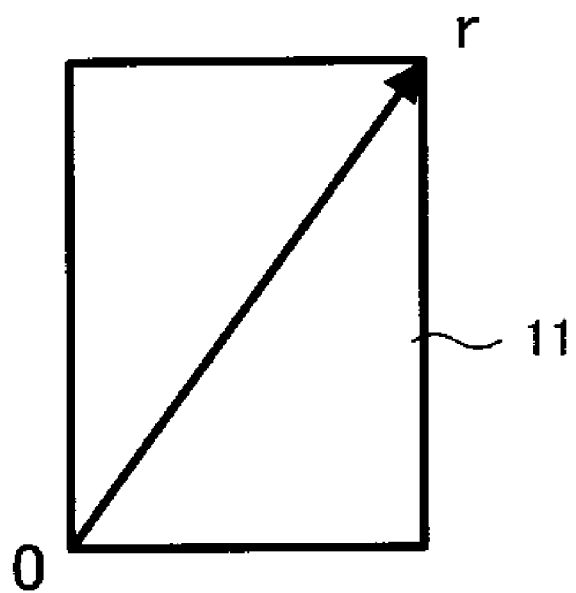
FIG. 19 is a view for explaining the definition of a position on the solid-state imaging element of FIG. 18.

Here, FIG. 18 is a view illustrating the amount of deformation of the solid-state imaging element 11 with respect to the shape and application position of each die bond agent. In FIG. 18, the horizontal axis represents the position on the solid-state imaging element 11, and the vertical axis represents the amount of deformation. Also, the position on the solid-state imaging element 11 means the position on a straight line passing through the lower left portion "0" of the element 11 and the upper right position "r" of the element as shown in FIG. 19.

Figure 17A:
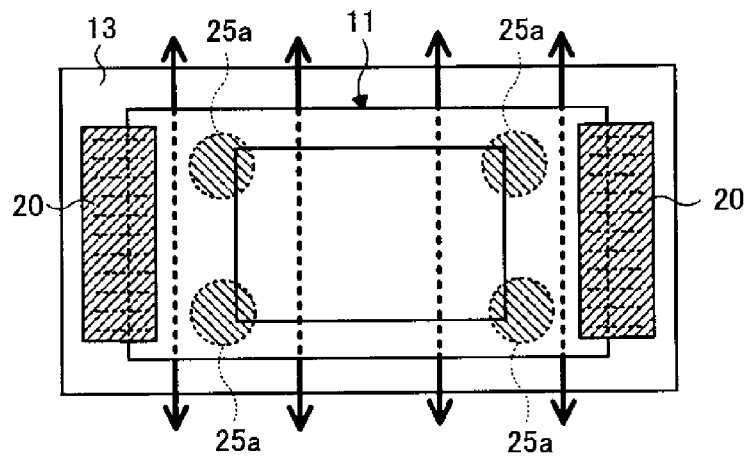
FIGS. 17A, 17B, and 17C are top views, which correspond to FIG. 3 and illustrate examples of the shape and application position of the die bond agent.
Figure 17B:
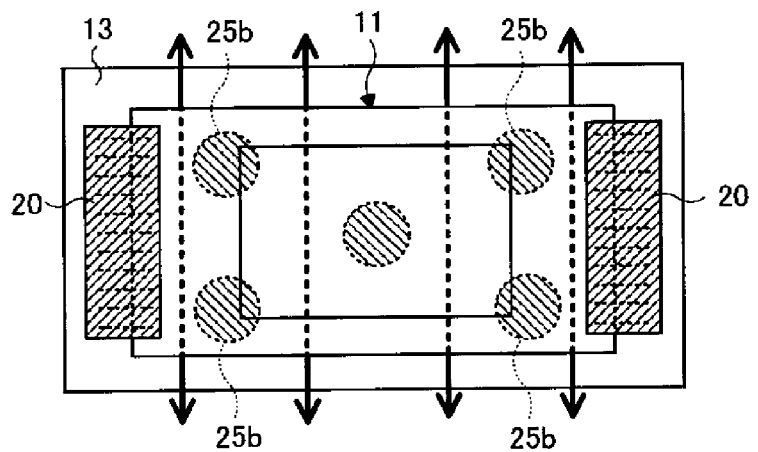
Figure 17C:
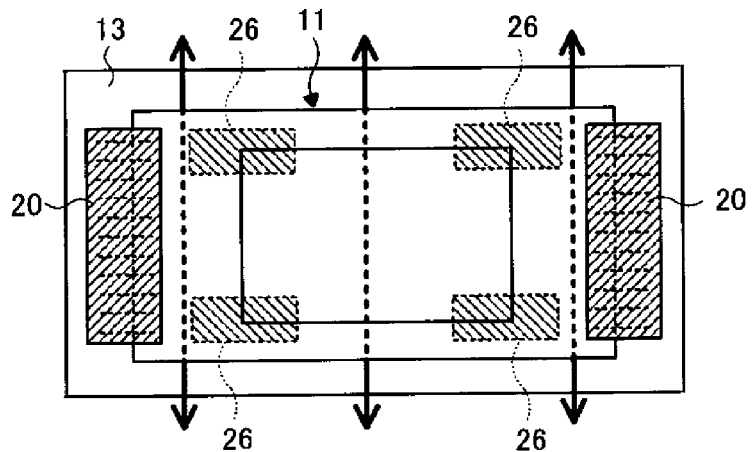

In FIG. 18, a curved line "A" represents the amount of deformation of the solid-state imaging element 11 in a case where the die bond agent 23a or 23b is provided as shown in a corresponding one of FIGS. 15A and 15B, and a curved line "B" represents the amount of deformation of the solid-state imaging element 11 in a case where the die bond agent 19 or 24 is provided as shown in a corresponding one of FIGS. 3 and 16, and a curved line "C" represents the amount of deformation of the solid-state imaging element 11 in a case where the die bond agent 25a, 25b, or 26 is provided as shown in a corresponding one of FIGS. 17A to 17C. Further, a curved line "D" represents the amount of deformation of the solid-state imaging element 11 in a case where a die bond agent is provided to be in contact with the entire rear surface of the solid-state imaging element 11 like in the solid-state imaging device according to the related art.

As shown by the curved line "A" of FIG. 18, the amount of deformation of the solid-state imaging element 11 is the smallest in the case where the die bond agent 23a or 23b is provided as shown in a corresponding one of FIGS. 15A and 15B. However, in this case, the adhesion strength of the solid-state imaging element 11 with respect to the dielectric substrate 13 is low, and in terms of the reliability of the device, a problem may occur.

In contrast to this, as shown by the curved line "B" of FIG. 18, in the case where the die bond agent 19 or 24 is provided as shown in a corresponding one of FIGS. 3 and 16, as compared to the case where the die bond agent 23a or 23b is provided as shown in a corresponding one of FIGS. 15A and 15B, the amount of deformation of the solid-state imaging element 11 slightly increases, but the adhesion strength of the solid-state imaging element 11 may be sufficiently obtained, and a solid-state imaging device having sufficiently high reliability may be obtained.

Also, as shown by the curved line "C" of FIG. 18, in the case where the die bond agent 25a, 25b, or 26 is provided as shown in a corresponding one of FIGS. 17A to 17C, the adhesion strength of the solid-state imaging element 11 is sufficient. However, it is possible to reduce the amount of deformation of the solid-state imaging element 11, as compared to the case where the die bond agent is provided to be in contact with the entire rear surface of the solid-state imaging element 11 (the curved line "D" of FIG. 18), but the amount of deformation of the solid-state imaging element 11 further increases.

As described above, when the die bond agent 19, 23a, 23b, 24, 25a, 25b, or 26 is provided to be in contact with some portions of the rear surface of the solid-state imaging element 11, it is possible to reduce deformation of the solid-state imaging element as compared to the solid-state imaging element according to the related art. Actually, the die bond agent needs only to be appropriately designed and provided in view of the adhesion strength of a solid-state imaging element and an amount of deformation of the solid-state imaging element, so as to be optimal for each product. When the die bond agent 19 or 24 is provided as shown in a corresponding one of FIGS. 3 and 16, it is possible to reduce deformation of the solid-state imaging element 11, and to bond the solid-state imaging element 11 with respect to the dielectric substrate 13 with a sufficient strength.

What is claimed is:

1. A solid-state imaging device comprising:
a dielectric substrate;
a solid-state imaging element disposed on the dielectric substrate, and including a photosensitive unit at a portion of a front surface thereof;
an adhesive between the dielectric substrate and the solid-state imaging element, the adhesive being in contact with a portion of a rear surface of the solid-state imaging element so as to permit air flow along other portions of the rear surface of the solid-state image element;
connection conductors that electrically connect the solid-state imaging element and the dielectric substrate;
a frame-shaped spacer disposed on the front surface of the solid-state imaging element to surround the photosensitive unit; and
an optical lid that is provided on the spacer.

2. The solid-state imaging device according to claim 1, further comprising a sealant that is provided along a side surface of the solid-state imaging element such that the connection conductors are covered by the sealant and the side surface of the solid-state imaging element is otherwise exposed.

3. The solid-state imaging device according to claim 1, wherein the adhesive includes a plurality of adhesive strips that are parallel to, and separated at a prescribed distance from, each other.

4. The solid-state imaging device according to claim 3, wherein the plurality of adhesive strips are parallel to one side of the solid-state imaging element.

5. The solid-state imaging device according to claim 4, wherein the solid-state imaging element is rectangular and has opposing long sides and opposing short sides, and the plurality of adhesive strips are parallel to the short sides of the solid-state imaging element.

6. The solid-state imaging device according to claim 4, wherein the solid-state imaging element is rectangular and has opposing long sides and opposing short sides, and the plurality of adhesive strips are parallel to the long sides of the solid-state imaging element.

7. The solid-state imaging device according to claim 1, further comprising a lid seal agent for hermetically sealing the optical lid to the frame-shaped spacer.

8. The solid-state imaging device according to claim 7, wherein the lid seal agent is made of ultraviolet curable adhesive.

9. The solid-state imaging device according to claim 1, wherein the connection conductors are disposed on two sides of the sold-state imaging device.

10. The solid-state imaging device according to claim 1, wherein the connection conductors are disposed on four sides of the sold-state imaging device.

11. The solid-state imaging device according to claim 1, wherein the connection conductors include conductors on the corners of the solid-state imaging device.

12. The solid-state imaging device according to claim 1, wherein the adhesive is a thermosetting adhesive.

13. The solid-state imaging device according to claim 1, wherein the spacer has a protruding upper portion that facilitates placement of the optical lid.

14. The solid-state imaging device according to claim 1, wherein the adhesive includes a plurality of circularly shaped areas.

15. A solid-state imaging device comprising:
a dielectric substrate;
a solid-state imaging element including a photosensitive unit at a portion of a front surface thereof and bonded to the dielectric substrate such that air vents are formed between the solid-state imaging element and the dielectric substrate to permit air to flow between the solid-state imaging element and the dielectric substrate;
connection conductors that electrically interconnect the solid-state imaging element and the dielectric substrate;
a frame-shaped spacer that is provided on the front surface of the solid-state imaging element so as to surround the photosensitive unit; and
an optical lid that is provided on the frame-shaped spacer to close the opening of the frame-shaped spacer.

16. The solid-state imaging device according to claim 15, wherein the solid-state imaging element is rectangular and has opposing long sides and opposing short sides, and the air vents are formed to permit air to flow between the short sides.

17. The solid-state imaging device according to claim 15, wherein the solid-state imaging element is rectangular and has opposing long sides and opposing short sides, and the air vents are formed to permit air to flow between the long sides.

18. The solid-state imaging device according to claim 15, wherein a plurality of circularly shaped adhesives are disposed between the solid-state imaging element and the dielectric substrate to bond the solid-state imaging element to the dielectric substrate.

19. A method for fabricating a solid-state imaging device, the method comprising:
applying an adhesive to a dielectric substrate, the adhesive laid down in a plurality of areas separated from each other;
disposing a solid-state imaging element against the adhesive areas such that a rear surface of the solid-state imaging element is in contact with the plurality of areas and is separated from the dielectric substrate;
connecting electrode pads on a side of the solid-state imaging element to electrode pads on the dielectric substrate via bonding wires;
applying a spacer adhesive in a ring shape that surrounds the solid-state imaging element;
applying a frame-shaped spacer to the spacer adhesive;
applying a sealant over the bonding wires to cover the bonding wires;
applying a lid seal agent in two separate U-shaped portions on the upper surface of the frame-shaped spacer; and
disposing an optical lid onto the frame-shaped spacer such that the opening of the frame-shaped spacer is closed by affixing the optical lid to the lid seal agent.

20. The method for fabricating according to claim 19, further comprising, after disposing the solid-state imaging element against adhesive areas, curing the adhesive while maintaining the separation of the rear surface of the solid-state imaging device from the front surface of the dielectric substrate.

\* \* \* \* \*